US012603645B2

(12) United States Patent
Kai

(10) Patent No.: US 12,603,645 B2
(45) Date of Patent: Apr. 14, 2026

(54) DISCHARGE CONTROL CIRCUIT

(71) Applicant: LAPIS Technology Co., Ltd.,
Yokohama (JP)

(72) Inventor: Takatsugu Kai, Yokohama (JP)

(73) Assignee: LAPIS Technology Co., Ltd.,
Yokohama (JP)

( * ) Notice: Subject to any disclaimer, the term of this
patent is extended or adjusted under 35
U.S.C. 154(b) by 109 days.

(21) Appl. No.: 18/581,298

(22) Filed: Feb. 19, 2024

(65) Prior Publication Data

US 2024/0291479 A1    Aug. 29, 2024

(30) Foreign Application Priority Data

Feb. 27, 2023    (JP) ................................. 2023-028966

(51) Int. Cl.
*H03K 17/10*        (2006.01)
*H03K 17/687*       (2006.01)
(52) U.S. Cl.
CPC ......... *H03K 17/102* (2013.01); *H03K 17/687*
(2013.01); *H03K 2217/0036* (2013.01)
(58) Field of Classification Search
CPC ............... H03K 17/102; H03K 17/687; H03K
2217/0036; H02M 1/0003; H02M 1/322;
H02M 1/34
See application file for complete search history.

(56) References Cited

U.S. PATENT DOCUMENTS

| | | | |
|---|---|---|---|
| 2005/0052217 A1* | 3/2005 | Furuie ................. | H03K 17/168 |
| | | | 327/434 |
| 2005/0067899 A1* | 3/2005 | Kawanishi ........... | H10D 89/601 |
| | | | 257/E23.153 |
| 2014/0347104 A1* | 11/2014 | Taylor ................. | H01J 49/022 |
| | | | 327/124 |
| 2023/0231018 A1* | 7/2023 | Kinoshita ............ | H10D 64/411 |

FOREIGN PATENT DOCUMENTS

| | | |
|---|---|---|
| JP | H01175614 | 7/1989 |
| JP | 2002116828 | 4/2002 |

* cited by examiner

*Primary Examiner* — Sibin Chen
(74) *Attorney, Agent, or Firm* — JCIPRNET

(57)    ABSTRACT

A discharge control circuit includes: a first gate voltage output circuit that outputs a first gate voltage supplied to a transistor connected to a capacitive load; a second gate voltage output circuit that outputs a second gate voltage supplied to the transistor; and a switching control circuit that switches supply of the first gate voltage and the second gate voltage to the transistor. The first gate voltage output circuit includes: a voltage supply circuit that supplies a voltage to a gate of the transistor until the transistor changes from an off state to an on state; and a current supply circuit that supplies a current to the gate of the transistor. The second gate voltage output circuit outputs a voltage at a constant level as the second gate voltage. The switching control circuit performs control to supply the second gate voltage after supplying the first gate voltage to the transistor.

7 Claims, 3 Drawing Sheets

Pre-discharge period
First switch: on
Second switch: off

Discharge period
First switch: off
Second switch: on

Comparative Example

※1 Discharge current when using only the second discharge path
※2 Discharge current when using the second discharge path after using the first discharge path

DISCHARGE CONTROL CIRCUIT

CROSS-REFERENCE TO RELATED APPLICATION

This application claims the priority benefits of Japanese application no. 2023-028966, filed on Feb. 27, 2023. The entirety of the above-mentioned patent application is hereby incorporated by reference herein and made a part of this specification.

BACKGROUND

Technical Field

The disclosed technology relates to a discharge control circuit.

Description of Related Art

The following techniques are known as techniques for suppressing an inrush current when power is turned on. For example, Patent Document 1 (Japanese Patent Application Laid-Open No. 2002-116828) describes an inrush current suppression circuit that switches the method of controlling a control voltage supplied to an inrush current suppression transistor depending on whether or not the inrush current has finished flowing, supplies the inrush current suppression transistor with a control voltage within a range where the internal resistance of the inrush current suppression transistor can suppress the inrush current while the inrush current is flowing, and supplies the inrush current suppression transistor with a control voltage so that the internal resistance of the inrush current suppression transistor has a sufficiently low value after the inrush current has finished flowing.

Patent Document 2 (Japanese Patent Application Laid-Open No. 1-175614) describes a voltage stabilizing circuit that includes a field effect transistor whose source terminal is connected to the negative polarity side of an input power supply and whose drain terminal is connected to the negative polarity side of a load, a comparator that compares the voltage supplied to the load with a reference voltage, a voltage amplifier that amplifies the output voltage of the comparator and provides the output voltage to the gate terminal of the field effect transistor, a current transformer in which a primary winding is formed between the source terminal of the field effect transistor and the negative polarity terminal of the input power supply and one end of a secondary winding that generates a voltage in the negative direction due to the current flowing through the primary winding is connected to the gate terminal of the field effect transistor, and a voltage switching circuit that clamps the gate voltage of the field effect transistor to a constant value with the input voltage of the input power supply.

The power supply to a capacitive load is controlled by turning on/off a transistor provided between the capacitive load and a power supply. When the transistor is switched from the off state to the on state, an inrush current flows in the power supply path as the charge accumulated in the capacitive load is discharged. An excessive inrush current may damage the load system.

As a countermeasure, a conceivable method is to provide a first discharge path including a current limiting resistor and a second discharge path not including a current limiting resistor, and to connect the capacitive load to the first discharge path to apply a discharge current to the first discharge path during a pre-discharge period immediately after power starts to be supplied to the capacitive load, and to connect the capacitive load to the second discharge path to supply power to the capacitive load using the second discharge path with low resistance during a subsequent discharge period. According to this method, however, a transistor is required for each of the first discharge path and the second discharge path to switch connection/disconnection with the capacitive load, which leads to an increase in cost.

In view of the above, the disclosed technology is to suppress an inrush current generated due to discharge of a capacitive load at low cost.

SUMMARY

A discharge control circuit according to the disclosed technology includes: a first gate voltage output circuit configured to output a first gate voltage supplied to a transistor connected to a capacitive load; a second gate voltage output circuit configured to output a second gate voltage supplied to the transistor; and a switching control circuit configured to switch supply of the first gate voltage and the second gate voltage to the transistor. The first gate voltage output circuit includes: a voltage supply circuit configured to supply a voltage to a gate of the transistor until the transistor changes from an off state to an on state; and a current supply circuit configured to supply a current to the gate of the transistor. The second gate voltage output circuit is configured to output a voltage at a constant level as the second gate voltage. The switching control circuit is configured to perform control to supply the second gate voltage after supplying the first gate voltage to the transistor.

DESCRIPTION OF THE EMBODIMENTS

Figure 1:
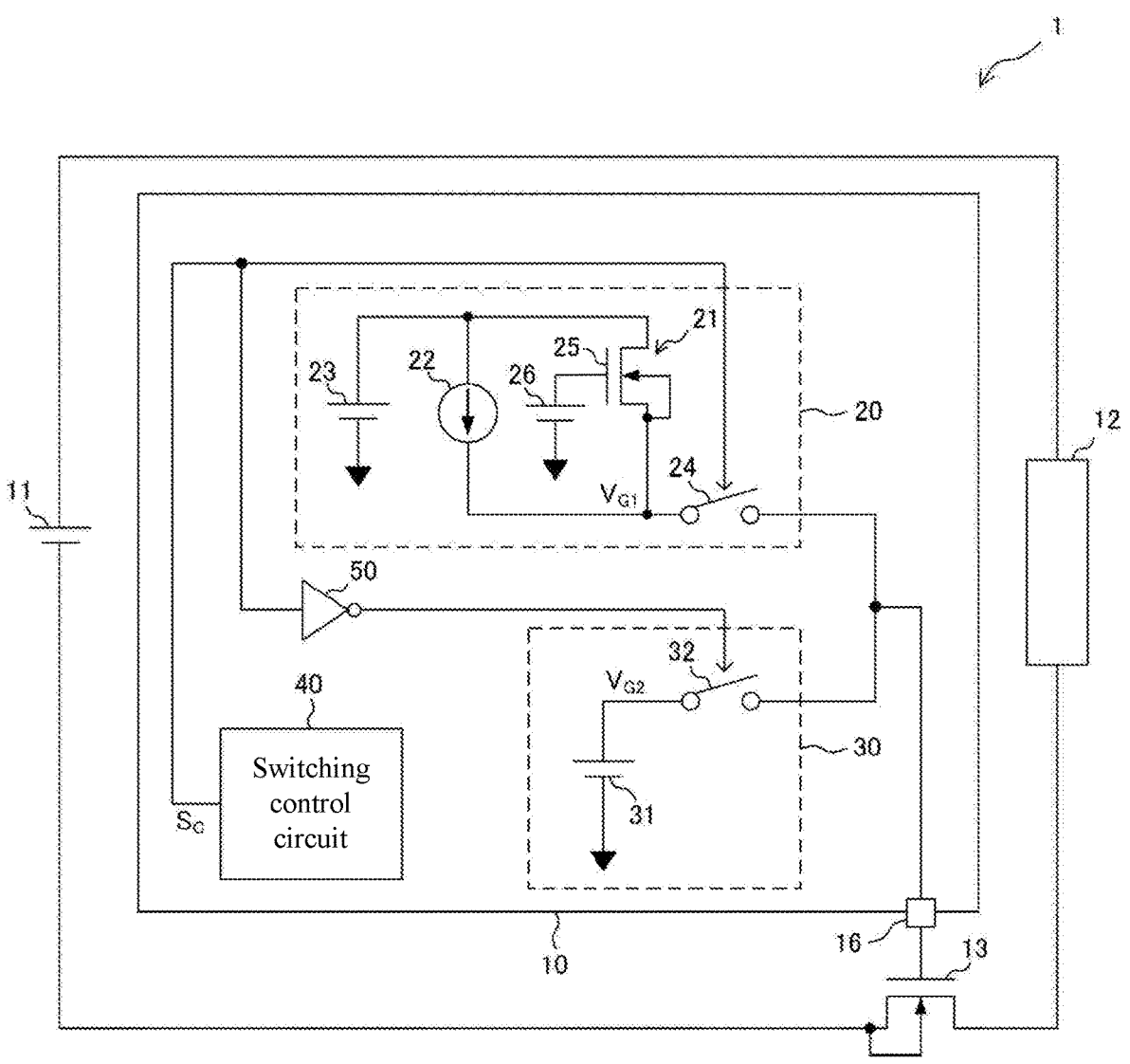
FIG. 1 is a diagram showing an example of the configuration of the load driving system including the discharge control circuit according to an embodiment of the disclosed technology.

An example of the embodiment of the disclosed technology will be described below with reference to the drawings. In addition, the same reference numerals are assigned to the same or equivalent components and parts in each drawing, and repeated description will be omitted.

The disclosed technology is capable of suppressing an inrush current generated due to discharge of a capacitive load at low cost.

FIG. 1 is a diagram showing an example of the configuration of a load driving system 1 including a discharge control circuit 10 according to an embodiment of the disclosed technology. The load driving system 1 includes a power supply 11, a capacitive load 12, and a transistor 13 as components other than the discharge control circuit 10. The load driving system 1 is a system that controls power supply to the capacitive load 12 by turning on/off the transistor 13.

The capacitive load 12 has one end connected to the positive electrode of the power supply 11 and the other end connected to the drain of the transistor 13. The transistor 13 is, for example, a field effect transistor, and has the drain connected to the capacitive load 12, the source connected to the negative electrode of the power supply 11, and the gate connected to a gate voltage output terminal 16 of the discharge control circuit 10. As the transistor 13 is set to the on state, the capacitive load 12 and the power supply 11 are connected, and power is supplied to the capacitive load 12. At this time, a discharge current accompanying discharge of the charge accumulated in the capacitive load 12 flows through the transistor 13.

The discharge control circuit 10 has a function of suppressing an inrush current that flows into the power supply path due to discharge of the capacitive load 12 when power is supplied to the capacitive load 12. The discharge control circuit 10 is composed of an integrated circuit provided on a semiconductor substrate. The discharge control circuit 10 includes a first gate voltage output circuit 20, a second gate voltage output circuit 30, a switching control circuit 40, and an inverter 50. The first gate voltage output circuit 20 includes a voltage supply circuit 21, a current supply circuit 22, a power supply circuit 23, and a first switch 24.

The voltage supply circuit 21 includes a transistor 25 and a bias circuit 26. The transistor 25 is, for example, a field effect transistor, and has the drain connected to the power supply circuit 23, the gate connected to the bias circuit 26, and the source connected to one end of the first switch 24. The bias circuit 26 supplies a bias voltage to the gate of the transistor 25. Thus, the transistor 25 is maintained in the on state.

The current supply circuit 22 is a current source that outputs a current with a constant current value, and has one end connected to the power supply circuit 23 and the other end connected to one end of the first switch 24. That is, the current supply circuit 22 is connected in parallel to the transistor 25. The current output from the current supply circuit 22 is set to substantially the same magnitude as the discharge current accompanying discharge of the charge accumulated in the parasitic capacitance between the gate and drain of the transistor 13.

The power supply circuit 23 is a power supply for driving the voltage supply circuit 21 and the current supply circuit 22. The first switch 24 is composed of a semiconductor element such as a transistor, and has one end connected to the source of the transistor 25 and the current supply circuit 22, and the other end connected to the gate of the transistor 13 via the gate voltage output terminal 16.

The first switch 24 is turned on/off according to a control signal $S_C$ supplied from the switching control circuit 40. By setting the first switch 24 to the on state, a voltage corresponding to the output voltage of the voltage supply circuit 21 and the output current of the current supply circuit 22 is supplied to the gate of the transistor 13 as a first gate voltage $V_{G1}$. The first gate voltage output circuit 20 controls the first gate voltage $V_{G1}$ so that the current flowing through the transistor 13 is constant.

The second gate voltage output circuit 30 includes a constant voltage source 31 and a second switch 32. The second switch 32 has one end connected to the constant voltage source 31 and the other end connected to the gate of the transistor 13 via the gate voltage output terminal 16. The second switch 32 is turned on/off according to the control signal $S_C$ supplied from the switching control circuit 40. By setting the second switch 32 to the on state, the output voltage of the constant voltage source 31 whose voltage level is constant is output as a second gate voltage $V_{G2}$, and is supplied to the gate of the transistor 13.

The switching control circuit 40 switches the supply of the first gate voltage $V_{G1}$ and the second gate voltage $V_{G2}$ to the transistor 13. The switching control of the switching control circuit 40 is performed based on the control signal $S_C$. The first switch 24 is supplied with the control signal $S_C$ directly, and the second switch 32 is supplied with the control signal $S_C$ whose logic has been inverted by the inverter 50. Thus, the first switch 24 and the second switch 32 are turned on/off in a complementary manner. That is, when the first switch 24 is set to the on state, the second switch 32 is set to the off state, and when the first switch 24 is set to the off state, the second switch 32 is set to the on state.

The switching control circuit 40 performs control to supply the first gate voltage $V_{G1}$ to the transistor 13 by setting the first switch 24 to the on state when power is supplied to the capacitive load 12, and then supply the second gate voltage $V_{G2}$ to the transistor 13 by setting the second switch 32 to the on state. The switching control circuit 40 may, for example, perform control to supply the second gate voltage $V_{G2}$ to the transistor 13 after a predetermined period has elapsed since the start of supply of the first gate voltage $V_{G1}$ to the transistor 13.

Figure 2:
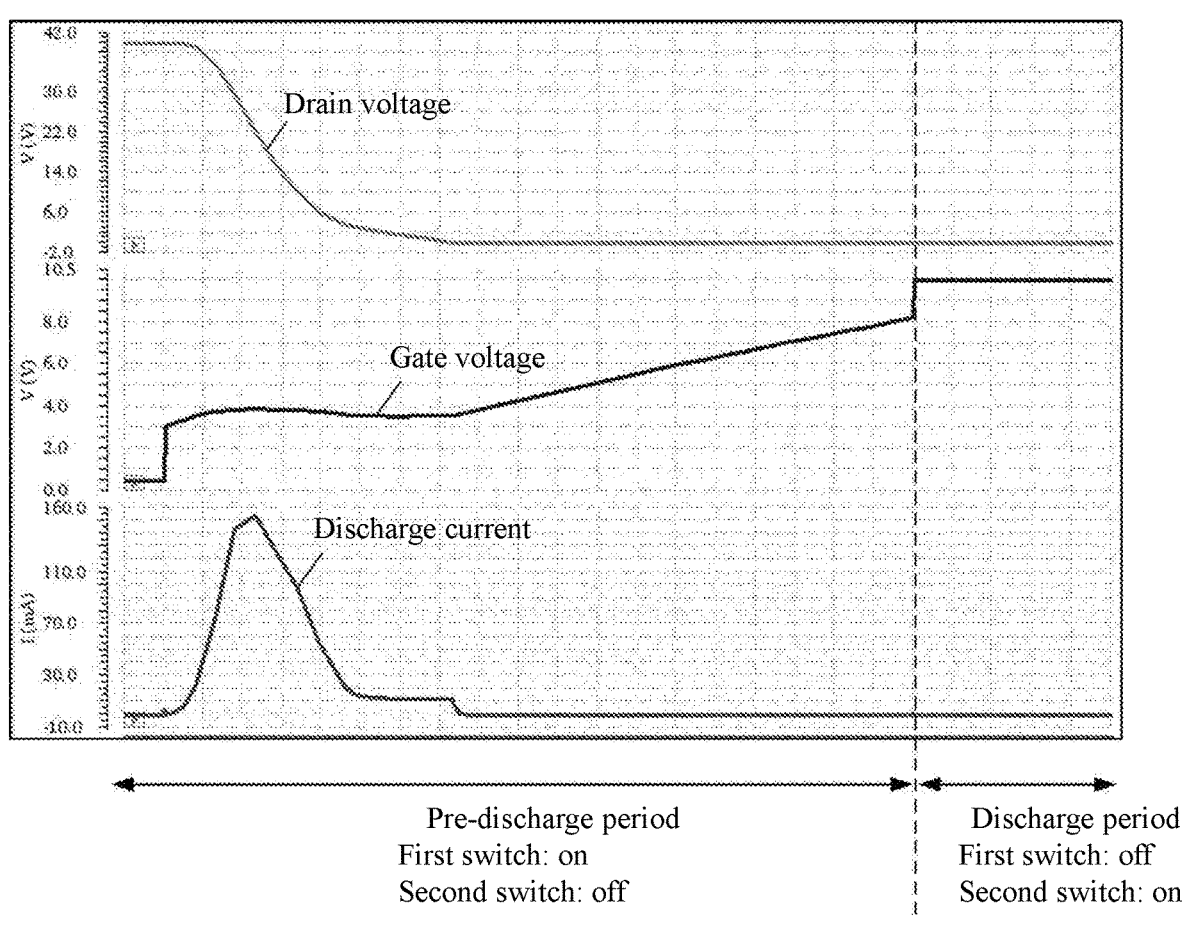
FIG. 2 is a diagram showing the operation waveforms of various parts obtained by an operation simulation performed on the load driving system according to an embodiment of the disclosed technology.

FIG. 2 is a diagram showing the operation waveforms of various parts obtained by an operation simulation performed on the load driving system 1. FIG. 2 shows the changes over time of the control signal $S_C$, the drain voltage and gate voltage of the transistor 13, and the discharge current.

When power is supplied to the capacitive load 12, the switching control circuit 40 outputs a high-level control signal $S_C$. Thus, the first switch 24 is set to the on state and the second switch 32 is set to the off state. As a result, the first gate voltage $V_{G1}$ output from the first gate voltage output circuit 20 is supplied to the gate of the transistor 13. When the first switch 24 shifts from the off state to the on state, the voltage supply circuit 21 rapidly increases the gate voltage of the transistor 13 until the transistor 13 switches from the off state to the on state. As a result, the source voltage of the transistor 25 increases, so the transistor 25 is set to the off state, and the voltage supply from the voltage supply circuit 21 to the gate of the transistor 13 stops.

When the transistor 13 switches from the off state to the on state, the charge accumulated in the capacitive load 12 starts to be discharged, and a discharge current flows through the power supply path that passes through the transistor 13. Along with this, the drain voltage of the transistor 13 decreases. At this time, while the charge accumulated in the parasitic capacitance between the gate and drain of the transistor 13 is discharged, the current supply circuit 22 continues to supply a current to the gate of the transistor 13. Since the discharge current accompanying discharge of the charge accumulated in the parasitic capacitance and the current supplied from the current supply circuit 22 to the gate of the transistor 13 have substantially the same magnitude, the gate voltage of the transistor 13 is maintained at a substantially constant level until the drain voltage of the transistor 13 reaches substantially zero and the discharge current accompanying discharge of the charge accumulated in the capacitive load 12 becomes substantially zero. Thus, the discharge current that accompanies discharge of the charge accumulated in the capacitive load 12 becomes substantially constant, making it possible to suppress an inrush current from being generated due to discharge of the capacitive load 12. According to the simulation result shown in FIG. 2, the peak value of the inrush current was suppressed to about 150 mA. The period in which the first gate voltage $V_{G1}$ is supplied to the gate of the transistor 13 is a pre-discharge period in which the charge accumulated in the capacitive load 12 starts to be discharged.

After the discharge of the charge accumulated in the capacitive load 12 is completed, the switching control circuit 40 outputs a low-level control signal $S_C$. Thus, the first switch 24 is set to the off state and the second switch 32 shifts to the on state. As a result, the second gate voltage $V_{G2}$ output from the second gate voltage output circuit 30 is supplied to the gate of the transistor 13. The second gate voltage output circuit 30 outputs a voltage at a constant level higher than the level of the first gate voltage $V_{G1}$ after completion of discharging the capacitive load 12 as the second gate voltage $V_{G2}$, and supplies the voltage to the gate of the transistor 13. Thus, the on state of the transistor 13 is maintained. The on-resistance of the transistor 13 when the second gate voltage $V_{G2}$ is supplied is lower than the on-resistance of the transistor 13 when the first gate voltage $V_{G1}$ is supplied. By reducing the on-resistance of the transistor, power can be supplied to the capacitive load 12 with low loss. The period in which the second gate voltage $V_{G2}$ is supplied to the gate of the transistor 13 is a discharge period in which power is continued to be supplied to the capacitive load 12 after the capacitive load 12 is discharged.

Figure 3:
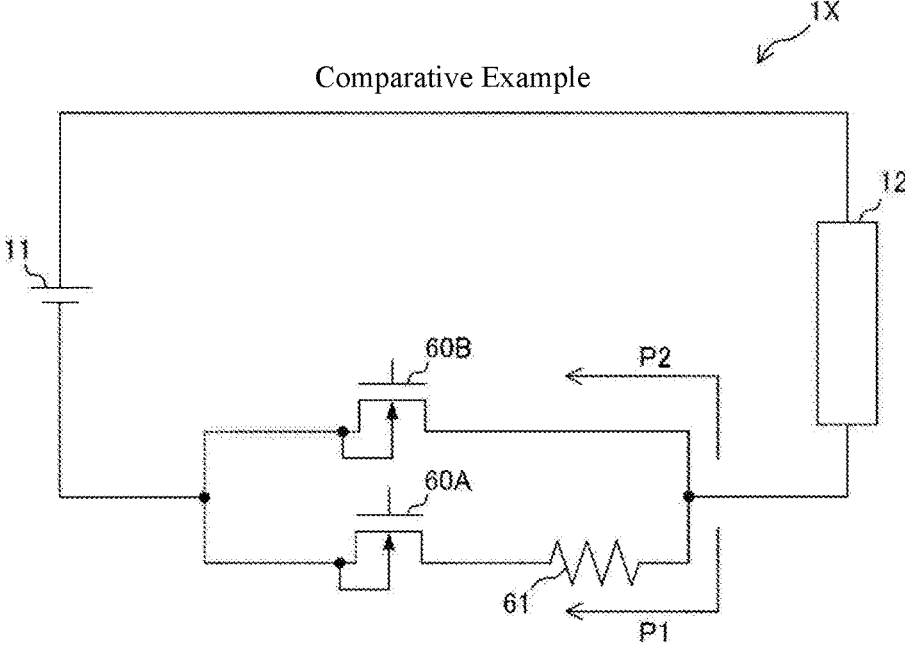
FIG. 3 is a diagram showing an example of the configuration of the load driving system according to a comparative example.

FIG. 3 is a diagram showing an example of the configuration of a load driving system 1X according to a comparative example. The load driving system 1X according to the comparative example has a first discharge path P1 including a current limiting resistor 61 and a transistor 60A, and a second discharge path P2 including a transistor 60B. In the pre-discharge period immediately after power starts to be supplied to the capacitive load 12, the transistor 60A is set to the on state and the transistor 60B is set to the off state. Thus, the capacitive load 12 is connected to the first discharge path P1, and a discharge current generated due to discharge of the charge accumulated in the capacitive load 12 flows to the first discharge path P1. An inrush current is suppressed by the current limiting resistor 61 provided in the first discharge path P1. In the subsequent discharge period, the transistor 60A is set to the off state and the transistor 60B is set to the on state. Thus, the capacitive load 12 is connected to the second discharge path P2, and power is supplied to the capacitive load 12 using the second discharge path P2 with low resistance.

Figure 4:
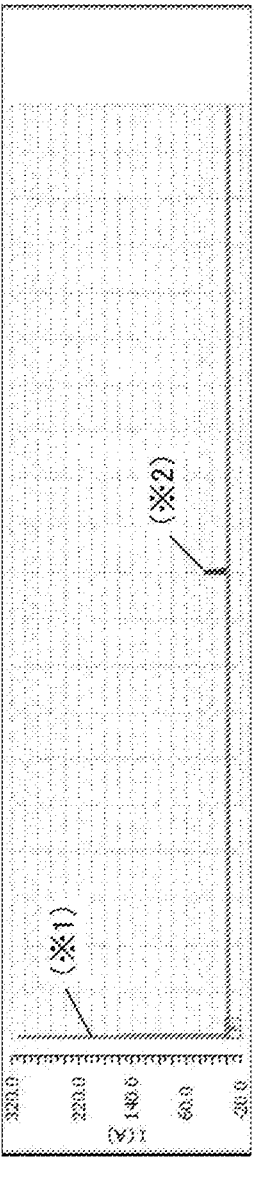
FIG. 4 is a diagram showing the operation waveforms of various parts obtained by an operation simulation performed on the load driving system according to a comparative example.

FIG. 4 is a diagram showing the operation waveforms of various parts obtained by an operation simulation performed on the load driving system 1X according to the comparative example. FIG. 4 shows the discharge current when the charge accumulated in the capacitive load 12 was discharged using only the second discharge path P2, and the discharge current when the charge was discharged using the second discharge path P2 after using the first discharge path P1. When the charge accumulated in the capacitive load 12 was discharged using only the second discharge path P2, the peak value of the inrush current was 310 A. On the other hand, when the charge accumulated in the capacitive load 12 was discharged using the second discharge path P2 after using the first discharge path P1, the peak value of the inrush current was 33 A. That is, by performing pre-discharge using the first discharge path P1, the peak value of the inrush current could be suppressed to about 1/10 of that in the case of performing discharge using only the second discharge path P2. However, according to this configuration, a transistor is required for each of the first discharge path P1 and the second discharge path P2, which leads to an increase in cost.

In contrast, with the discharge control circuit 10 according to the embodiment of the disclosed technology, the gate voltage supplied to the transistor 13 is switched to switch the on-resistance of the transistor 13 and thereby switch the electrical resistance on the discharge path, so the number of transistors provided on the discharge path can be reduced to one. Furthermore, with the discharge control circuit 10 according to the present embodiment, the first gate voltage output circuit 20 controls the first gate voltage $V_{G1}$ so that the discharge current flowing through the transistor 13 is constant, so the inrush current can be effectively suppressed.

Regarding the above embodiment, the following additional notes are further disclosed.

(Additional Note 1)

A discharge control circuit, including:

a first gate voltage output circuit configured to output a first gate voltage supplied to a transistor connected to a capacitive load;

a second gate voltage output circuit configured to output a second gate voltage supplied to the transistor; and a switching control circuit configured to switch supply of the first gate voltage and the second gate voltage to the transistor, wherein the first gate voltage output circuit includes:

a voltage supply circuit configured to supply a voltage to a gate of the transistor until the transistor changes from an off state to an on state; and a current supply circuit configured to supply a current to the gate of the transistor, the second gate voltage output circuit is configured to output a voltage at a constant level as the second gate voltage, and the switching control circuit is configured to perform control to supply the second gate voltage after supplying the first gate voltage to the transistor.

(Additional Note 2)

The discharge control circuit according to additional note 1, wherein the first gate voltage output circuit is configured to control the first gate voltage so that the current flowing through the transistor is constant.

(Additional Note 3)

The discharge control circuit according to additional note 1 or additional note 2, wherein a magnitude of the current supplied from the current supply circuit to the gate of the transistor is the same as a magnitude of a discharge current accompanying discharge of charge accumulated in a parasitic capacitance between the gate and a drain of the transistor.

(Additional Note 4)

The discharge control circuit according to any one of additional notes 1 to 3, wherein a level of the second gate voltage is higher than a level of the first gate voltage.

What is claimed is:

1. A discharge control circuit, comprising:

a first gate voltage output circuit configured to output a first gate voltage supplied to a transistor connected to a capacitive load;

a second gate voltage output circuit configured to output a second gate voltage supplied to the transistor; and a switching control circuit configured to switch supply of the first gate voltage and the second gate voltage to the transistor, wherein the first gate voltage output circuit comprises:

a voltage supply circuit configured to supply a voltage to a gate of the transistor until the transistor changes from an off state to an on state;

a current supply circuit configured to supply a current to the gate of the transistor; and a power supply circuit connected to the voltage supply circuit and the current supply circuit, the second gate voltage output circuit is configured to output a voltage at a constant level as the second gate voltage, and the switching control circuit is configured to perform control to supply the second gate voltage after supplying the first gate voltage to the transistor.

2. The discharge control circuit according to claim 1, wherein the first gate voltage output circuit is configured to control the first gate voltage so that the current flowing through the transistor is constant.

3. The discharge control circuit according to claim 2, wherein a level of the second gate voltage is higher than a level of the first gate voltage.

4. The discharge control circuit according to claim 1, wherein a magnitude of the current supplied from the current supply circuit to the gate of the transistor is the same as a magnitude of a discharge current accompanying discharge of charge accumulated in a parasitic capacitance between the gate and a drain of the transistor.

5. The discharge control circuit according to claim 4, wherein a level of the second gate voltage is higher than a level of the first gate voltage.

6. The discharge control circuit according to claim 1, wherein a level of the second gate voltage is higher than a level of the first gate voltage.

7. The discharge control circuit according to claim 1, wherein the first gate voltage output circuit further comprises:

a first switch, having one end connected to the voltage supply circuit and the current supply circuit, and the other end connected to the transistor connected to the capacitive load.

* * * * *